(12) United States Patent
Fudeta et al.

(10) Patent No.: US 7,858,414 B2
(45) Date of Patent: Dec. 28, 2010

(54) NITRIDE SEMICONDUCTOR DEVICE AND MANUFACTURING METHOD THEREOF

(75) Inventors: Mayuko Fudeta, Mihara (JP); Satoshi Komada, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 868 days.

(21) Appl. No.: 11/378,767

(22) Filed: Mar. 17, 2006

(65) Prior Publication Data

US 2006/0223330 A1 Oct. 5, 2006

(30) Foreign Application Priority Data

Mar. 18, 2005 (JP) ............................. 2005-079568
Jan. 13, 2006 (JP) ............................. 2006-006437

(51) Int. Cl.
*H01L 21/00* (2006.01)

(52) U.S. Cl. .............................. 438/33; 438/42; 438/44

(58) Field of Classification Search .................... 438/33, 438/42, 44
See application file for complete search history.

(56) References Cited

U.S. PATENT DOCUMENTS

| 6,462,358 | B1 | 10/2002 | Lin et al. | |
|---|---|---|---|---|
| 6,495,867 | B1 | 12/2002 | Chen et al. | |
| 6,593,016 | B1 | 7/2003 | Chiyo et al. | |
| 6,630,692 | B2 | 10/2003 | Goetz et al. | |
| 6,630,695 | B2 | 10/2003 | Chen et al. | |
| 6,770,131 | B2 | 8/2004 | Lange et al. | |
| 6,821,805 | B1 | 11/2004 | Nakamura et al. | |
| 7,332,411 | B2 * | 2/2008 | McKinnell et al. | 438/456 |
| 2002/0094002 | A1 | 7/2002 | Amano et al. | |
| 2002/0182889 | A1 * | 12/2002 | Solomon et al. | 438/778 |
| 2002/0190259 | A1 | 12/2002 | Goetz et al. | |
| 2003/0047741 | A1 | 3/2003 | Hata et al. | |
| 2004/0056254 | A1 | 3/2004 | Bader et al. | |
| 2004/0152321 | A1 * | 8/2004 | Gehrke et al. | 438/689 |
| 2004/0191942 | A1 | 9/2004 | Kawakami et al. | |
| 2004/0218643 | A1 * | 11/2004 | Wickman et al. | 372/33 |
| 2005/0041715 | A1 | 2/2005 | Kim | |
| 2005/0093099 | A1 * | 5/2005 | Koike et al. | 257/615 |
| 2005/0161702 | A1 * | 7/2005 | Linthicum et al. | 257/183 |
| 2005/0179130 | A1 * | 8/2005 | Tanaka et al. | 257/730 |
| 2006/0099730 | A1 * | 5/2006 | Lee et al. | 438/46 |
| 2007/0205490 | A1 * | 9/2007 | Kusunoki | 257/620 |
| 2008/0223285 | A1 * | 9/2008 | Lee | 117/2 |

FOREIGN PATENT DOCUMENTS

| CN | 1585216 | 2/2005 |
|---|---|---|
| EP | 0 942 459 A1 | 9/1999 |
| JP | 2001-053056 A | 2/2001 |
| TW | 406445 | 9/2000 |

(Continued)

*Primary Examiner*—N Drew Richards
*Assistant Examiner*—Jae Lee
(74) *Attorney, Agent, or Firm*—Morrison & Foerster LLP

(57) ABSTRACT

A method of manufacturing a nitride semiconductor device includes the steps of forming a groove on a surface of a first substrate by scribing, and forming a nitride semiconductor layer on the surface where the groove is formed. In addition, the method includes the steps of bonding the nitride semiconductor layer and a second substrate together and separating the nitride semiconductor layer and the first substrate from each other. With this manufacturing method, a nitride semiconductor device can be obtained with high yield.

4 Claims, 3 Drawing Sheets

FOREIGN PATENT DOCUMENTS

| | | |
|---|---|---|
| TW | 463241 | 11/2001 |
| TW | 469654 | 12/2001 |
| TW | 558845 | 10/2003 |
| TW | 560091 | 11/2003 |
| TW | 567616 | 12/2003 |

* cited by examiner

NITRIDE SEMICONDUCTOR DEVICE AND MANUFACTURING METHOD THEREOF

This application claims priority under 35 USC 119 from Japanese Patent Applications Nos. 2005-079568 and 2006-006437 filed Mar. 18, 2005 and Jan. 13, 2006, respectively, the entire contents of which are hereby incorporated by reference.

FIELD OF THE INVENTION

The present invention relates to a nitride semiconductor device and a manufacturing method thereof, and more particularly to a method of manufacturing a nitride semiconductor device with high yield.

BACKGROUND OF THE INVENTION

A method of separating an epitaxial semiconductor layer that has grown on a first substrate from the first substrate and moving the same onto a second substrate has been proposed as a method suitable for manufacturing a semiconductor device (see, for example, Japanese Patent Laying-Open No. 2001-053056 (hereinafter, referred to as Patent Document 1)).

A method disclosed in Patent Document 1 will be described hereinafter with reference to FIGS. 5A to 5D. Initially, referring to FIG. 5A, a first epitaxial GaN layer 52 and a mask 54 are successively formed on a sapphire substrate 51 serving as a first substrate. Here, a material that is unlikely to epitaxially grow, such as silicon dioxide ($SiO_2$) or tungsten, is employed for mask 54. Mask 54 is provided so as to cover a part of a surface of first epitaxial GaN layer 52. Here, first epitaxial GaN layer 52 serves as a seed layer. Accordingly, after second epitaxial GaN layer 57 fills a window (opening) in mask 54, a continuous second epitaxial GaN layer 57 is formed on first epitaxial GaN layer 52 and mask 54.

Referring next to FIG. 5B, a trench (groove or recess) 60 extending through second epitaxial GaN layer 57 and exposing mask 54 is formed. Trench 60 is formed, for example, by etching second epitaxial GaN layer 57 so as to expose mask 54.

Referring next to FIG. 5C, a second substrate 58 is attached to an exposed surface of second epitaxial GaN layer 57. Second substrate 58 is bonded to second epitaxial GaN layer 57 with an already known wafer bonding method. Here, a conductive substrate composed of silicon (Si) is used as second substrate 58.

Thereafter, a chemical etchant is introduced in trench 60, so as to etch mask 54. Here, $SiO_2$ is used for mask 54, while hydrofluoric acid (HF) is used as the chemical etchant. HF chemically attacks mask 54, and etches mask 54 at a rate greater than that in etching first epitaxial GaN layer 52, second epitaxial GaN layer 57 or second substrate 58. When mask 54 is etched away, second epitaxial GaN layer 57 is separated from sapphire substrate 51 and first epitaxial GaN layer 52.

Referring next to FIG. 5D, a polyimide material 59 fills trench 60, thus forming a semiconductor device.

According to the method described above, however, initially, first epitaxial GaN layer 52 is formed on the entire surface of sapphire substrate 51. Accordingly, warping of a wafer including the sapphire substrate, the GaN layer and the mask layer is caused due to difference in thermal expansion coefficient between the sapphire substrate and the GaN layer. Here, uniform adhesion in wafer bonding of second substrate 58 (Si substrate) to second epitaxial GaN layer 57 cannot be achieved because of such warping, and yield becomes very poor. In addition, crystal growth of the epitaxial GaN layer cannot be continuous. That is, the step of forming mask 54 between the first epitaxial GaN layer and the second epitaxial GaN layer is interposed, which means that crystal growth of the GaN layer is divided into two stages, resulting in expensive cost. Moreover, as trench 60 portion is removed and thrown away, the material is wasted and the cost is increased. Meanwhile, in the method of etching mask 54 with a chemical etchant, the mask is not sufficiently impregnated with the chemical etchant, because mask 54 is thin and a region of trench 60 is also thin and narrow. Accordingly, separation of the epitaxial layer from the sapphire substrate is difficult, and yield is poor.

SUMMARY OF THE INVENTION

An object of the present invention is to provide a method of manufacturing a nitride semiconductor device with high yield.

The present invention is directed to a method of manufacturing a nitride semiconductor device including the steps of forming a groove on a surface of a first substrate by scribing, and forming a nitride semiconductor layer on the surface where the groove is formed.

In the method of manufacturing a nitride semiconductor device according to the present invention, in the step of forming a groove, the surface of the first substrate may be scribed by bringing a sharp article into contact with the surface of the first substrate. Alternatively, in the step of forming a groove, the surface of the first substrate may be scribed by irradiating the surface of the first substrate with a laser beam. Further, in the step of forming a groove, the groove may be formed at a pitch as large as integer multiple, equal to or larger than 1, of a length of one side of one nitride semiconductor device chip. Here, the groove may have a width from at least 1 μm to at most 350 μm. The first substrate may be implemented by a sapphire substrate, an Si substrate or an SiC substrate.

In the method of manufacturing a nitride semiconductor device according to the present invention, the step of forming a nitride semiconductor layer may include the step of forming at least a buffer layer, an n-type nitride semiconductor layer, a light-emitting layer, and a p-type nitride semiconductor layer in this order. In addition, the light-emitting layer may be formed continuously in a plane in parallel to a main surface of the first substrate.

In addition to the steps described above, the method of manufacturing a nitride semiconductor device according to the present invention may further include the steps of bonding the nitride semiconductor layer and a second substrate together, and separating the nitride semiconductor layer and the first substrate from each other. In the step of separating the nitride semiconductor layer and the first substrate form each other, a laser beam may be employed. The step of bonding the nitride semiconductor layer and the second substrate together may be performed in at least one of a heated atmosphere at a temperature not lower than a room temperature and a pressurized atmosphere at a pressure not lower than an atmospheric pressure. In addition, in the step of bonding the nitride semiconductor layer and the second substrate together, a eutectic bonding metal may be employed as a bonding material.

In addition to the steps described above, the method of manufacturing a nitride semiconductor device according to the present invention may further include the step of forming an electrode on the nitride semiconductor layer such that a groove formed in the nitride semiconductor layer and a position of division coincide with each other in division into chips.

In addition to the steps described above, the method of manufacturing a nitride semiconductor device according to the present invention may further include the chip division step of dividing a wafer including the second substrate and the nitride semiconductor layer into chips. In the chip division step, the wafer may be divided into chips such that a groove formed in the nitride semiconductor layer and a position of division coincide with each other.

The present invention is directed to a nitride semiconductor device including a conductive substrate, a nitride semiconductor layer, and a bonding layer formed from a eutectic bonding metal between the conductive substrate and the nitride semiconductor layer, the eutectic bonding metal containing AuSn.

In addition, the present invention is directed to a nitride semiconductor device including a conductive substrate, a nitride semiconductor layer, and a metal layer formed between the conductive substrate and the nitride semiconductor layer.

In the nitride semiconductor device according to the present invention, the conductive substrate may be implemented by an Si substrate, an SiC substrate or a III-V group compound substrate. The metal layer may have high reflectivity to a light emission wavelength of the device. The metal layer may contain Ag.

According to the present invention, a method of manufacturing a nitride semiconductor device with high yield can be provided.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1:
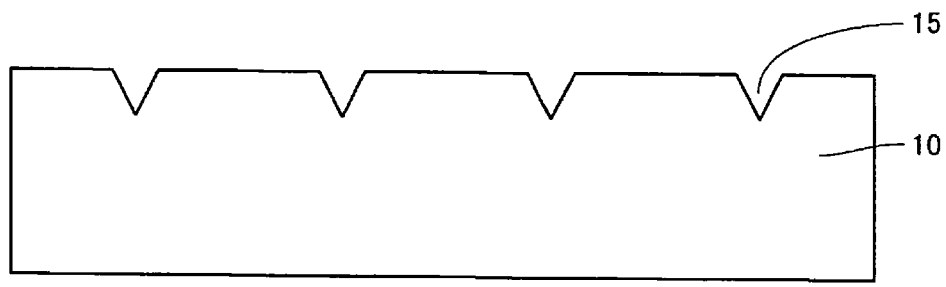
FIG. 1 is a schematic cross-sectional view showing the step of forming a groove on a surface of a first substrate.
Figure 2A:
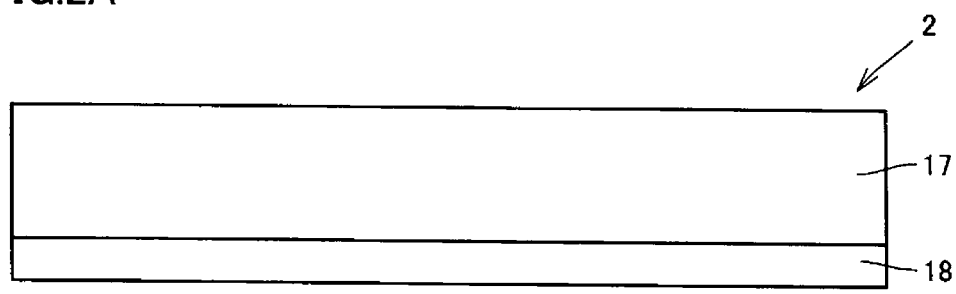
FIG. 2A is a schematic cross-sectional view showing the step of forming a bonding layer on a second substrate.
Figure 2B:
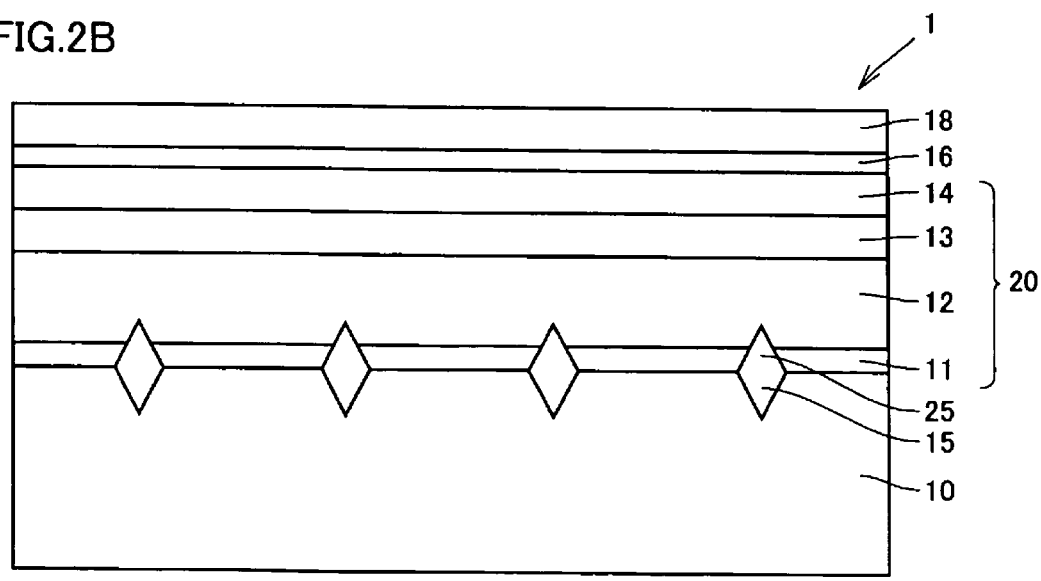
FIG. 2B is a schematic cross-sectional view showing the steps of forming a nitride semiconductor layer on the surface of the first substrate where the groove is formed, forming a metal layer, and forming a bonding layer.

A method of manufacturing a nitride semiconductor device according to the present invention includes the steps of forming a groove 15 on a surface of a first substrate 10 by scribing as shown in FIG. 1, and forming a nitride semiconductor layer 20 on the surface where groove 15 is formed as shown in FIG. 2B. Here, a scribe line refers to a line formed like a groove in a material (such as a first substrate and/or a second substrate) as a marker for manufacturing a nitride semiconductor device.

When groove 15 is formed on the surface of first substrate 10 and nitride semiconductor layer 20 is grown thereon, the groove 15 is formed such that the nitride semiconductor layer 20 cannot epitaxially grow on groove 15, and in nitride semiconductor layer 20, a groove 25 is formed above groove 15 (see FIG. 2B), or nitride semiconductor layer 20 is separate from first substrate 10 at groove 15 (not shown). Accordingly, strain due to difference in thermal expansion coefficient between first substrate 10 and nitride semiconductor layer 20 is mitigated and warping of the wafer is lessened. Therefore, subsequent bonding (adhesion) of nitride semiconductor layer 20 and the second substrate together, and forming of an electrode is facilitated, thereby improving yield. Here, the nitride semiconductor layer refers to a layer formed from a nitride semiconductor such as $In_x Al_y Ga_{1-x-y}N$ ($0 \leq x$, $0 \leq y$, $x+y \leq 1$) or the like.

In the step of forming groove 15, preferably, the surface of the first substrate is scribed by bringing a sharp article into contact with the surface of the first substrate or by irradiating the surface of the first substrate with a laser beam. By doing so, the scribe line can easily be provided.

Preferably, groove 15 is formed at a pitch as large as integer multiple, equal to or larger than 1, of a length of one side of one nitride semiconductor device chip to be fabricated. Efficient division into chips can be achieved by causing a position of groove 15 to coincide with a position of chip division.

In addition, preferably, groove 15 has a width from at least 1 μm to at most 350 μm. If the groove has a width less than 1 μm, strain caused between first substrate 10 and nitride semiconductor layer 20 is not sufficiently mitigated and warping of the wafer is not lessened. On the other hand, if the groove has a width exceeding 350 μm, the number of chips that can be obtained per one wafer decreases and the cost increases. Preferably, groove 15 has a depth from at least 0.5 μm to at most 100 μm and not larger than 50% of a thickness of first substrate 10. If groove 15 has a depth less than 0.5 μm, groove 25 is not formed in nitride semiconductor layer 20 and yield in division into chips cannot be improved. On the other hand, if groove 15 has a depth exceeding 100 μm or 50% of the thickness of first substrate 10, defect such as cracking of first substrate 10 during epitaxial growth of nitride semiconductor layer 20 is caused.

First substrate 10 is not particularly limited, so long as the substrate allows epitaxial growth of the nitride semiconductor layer thereon. From the viewpoint of easy epitaxial growth of the nitride semiconductor layer, however, a sapphire substrate, an Si substrate or an SiC substrate is preferably employed.

Referring to FIG. 2B, the step of forming the nitride semiconductor layer preferably includes the step of forming at least a buffer layer 11, an n-type nitride semiconductor layer 12, a light-emitting layer 13, and a p-type nitride semiconductor layer 14 in this order. Nitride semiconductor layer 20 structured as above is formed, so that a light-emitting device can readily be fabricated.

In addition, referring to FIG. 2B, preferably, light-emitting layer 13 is formed continuously in a plane in parallel to a main surface of first substrate 10. Namely, referring to FIG. 3, light-emitting layer 13 is preferably formed integrally, such that regions to be divided at a position of division 30 at the time of division into chips are connected to each other in the plane in parallel to the main surface of first substrate 10. Light-emitting layer 13 as above is formed, so that a cross-section of light-emitting layer 13 is exposed at a chip end portion after division into chips, and efficiency in extracting light at the chip end portion is improved.

Referring to FIGS. 2A and 2B, in addition to the steps described above, the method of manufacturing a nitride semiconductor device according to the present invention may further include the steps of bonding (adhering) nitride semiconductor layer 20 and a second substrate 17 together, and separating nitride semiconductor layer 20 and first substrate 10. By employing these steps, uniform adhesion between of nitride semiconductor layer 20 and second substrate 17 can be achieved and yield can be improved.

Though the method of separating nitride semiconductor layer 20 and first substrate 10 from each other is not particularly limited, a separation method using a laser beam is advantageous, because this method does not require an etching mask and loss of nitride semiconductor layer 20 is not great, as compared with the separation method using etching.

From the viewpoint of uniform and tight adhesion, the step of bonding nitride semiconductor layer 20 and second substrate 17 together is preferably performed in at least one of a heated atmosphere at a temperature not lower than a room temperature and a pressurized atmosphere at a pressure not lower than an atmospheric pressure. The temperature of the heated atmosphere is set preferably to 200° C. or higher, and more preferably to 270° C. or higher. Meanwhile, the pressure of the pressurized atmosphere is set preferably to 1 kPa (0.1 N/cm$^2$) or greater, and more preferably to 10 kPa (1 N/cm$^2$) or greater.

In the step of bonding nitride semiconductor layer 20 and second substrate 17 together, a eutectic bonding metal is preferably employed as a bonding material. Here, the eutectic bonding metal refers to a metal (alloy) in which two or more types of metals are mixed and melted at a temperature lower than a melting point of each metal. Examples of the eutectic bonding metal include AuSn, AuGe, SnAg, SnAgCu, and the like. Among these eutectic bonding metals, the metal containing AuSn is preferred, in view of resistance to temperature in subsequent steps, adhesion strength, cost, and reliability.

In addition to the steps described above, referring to FIG. 3, the method of manufacturing a nitride semiconductor device according to the present invention may further include the step of forming an electrode 19 on nitride semiconductor layer 20 such that groove 25 formed on the surface of nitride semiconductor layer 20 and position of division 30 coincide with each other in division into chips. By employing this step, a light-emitting device can be fabricated with high yield.

In addition to the steps described above, referring to FIG. 3, the method of manufacturing a nitride semiconductor device according to the present invention may further include the chip division step of dividing a wafer including second substrate 17 and nitride semiconductor layer 20 into chips. In the chip division step, the wafer may be divided into chips such that groove 25 formed on the surface of nitride semiconductor layer 20 and position of division 30 coincide with each other. By employing this step, a light-emitting device can be fabricated with high yield. Though the method of dividing the wafer into chips such that groove 25 and position of division 30 coincide with each other is not particularly limited, for example, a method of dividing the wafer by scribing 31 the surface of second substrate 17 such that scribe line 31 coincides with a position of groove 25 and by applying a pressure to the wafer, or a method of dividing the wafer by irradiating the wafer with a laser beam 33 from the side of second substrate 17 such that laser beam 33 coincides with the position of groove 25, without scribing 31, is preferred. A method of scribing 31 the surface of second substrate 17 is preferably implemented by a method of bringing a sharp article into contact with the surface of second substrate 17 or a method of irradiating the surface of the same with laser beam 33.

Figure 3:
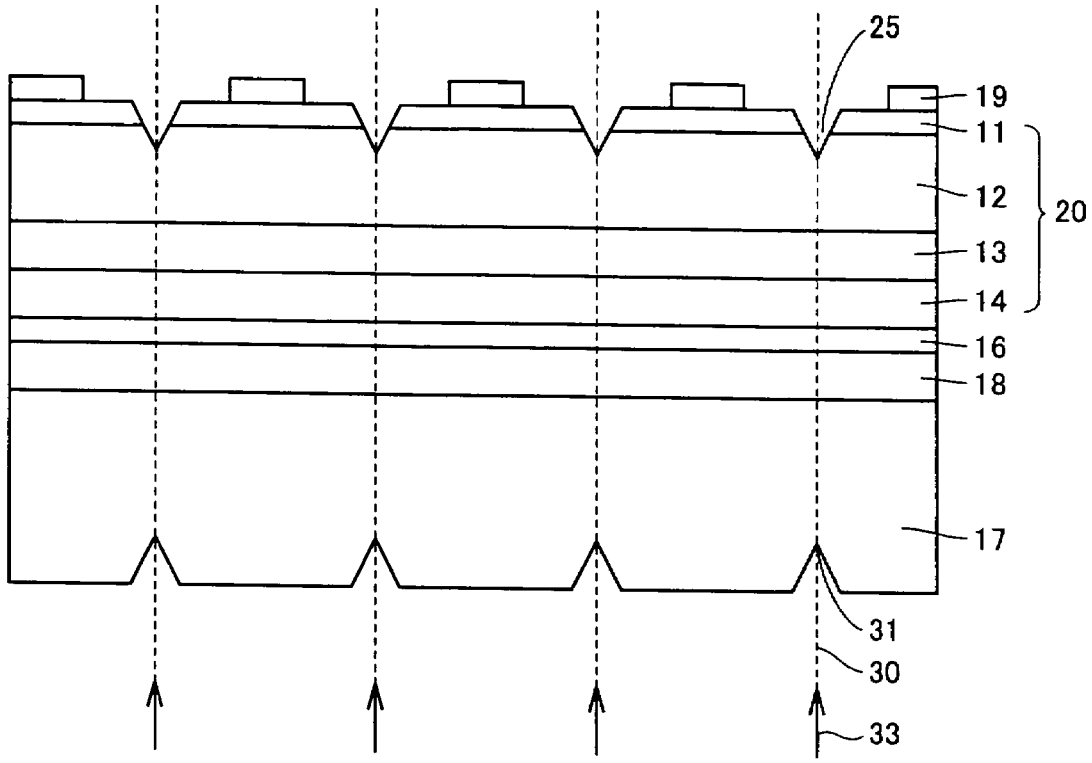
FIG. 3 is a schematic cross-sectional view showing the steps of bonding the nitride semiconductor layer and the second substrate together, separating the nitride semiconductor layer and the first substrate from each other and forming an electrode on the nitride semiconductor layer, as well as the chip division step.

Referring to FIGS. 2B and 3, in the method of manufacturing a nitride semiconductor device according to the present invention, a conductive substrate is preferably employed as second substrate 17. By employing the conductive substrate, electrodes can be provided on main surfaces on respective opposing sides of the nitride semiconductor device, and a light-emitting device attaining high light-emission efficiency can be fabricated.

Referring to FIG. 3, a nitride semiconductor device according to the present invention includes a conductive substrate (second substrate 17), nitride semiconductor layer 20, and a bonding layer 18 formed from a eutectic bonding metal between the conductive substrate and the nitride semiconductor layer, and the eutectic bonding metal contains AuSn. With such a structure, a light-emitting device attaining high light-emission efficiency can be obtained.

Referring to FIG. 3, another nitride semiconductor device according to the present invention includes a conductive substrate (second substrate 17), nitride semiconductor layer 20, and a metal layer 16 formed between the conductive substrate and the nitride semiconductor layer. By including such metal layer 16, a light-emitting device attaining high light-emission efficiency can be obtained. Here, from the viewpoint of further higher light-emission efficiency, metal layer 16 preferably has high reflectivity to a light-emission wavelength of the device. In addition, from the viewpoint of high reflectivity in a wide wavelength range, reliability and cost, metal layer 16 preferably contains Ag. The conductive substrate is preferably implemented by an Si substrate, an SiC substrate or a III-V group compound substrate. Here, a GaAs substrate, a GaP substrate, a GaN substrate, an AlGaN substrate, and the like are preferred as the III-V group compound substrate.

Example 1

An example of a method of manufacturing a nitride semiconductor device according to the present invention will be described in the following. Initially, referring to FIG. 1, a sapphire substrate having a thickness of 430 μm is used as first substrate 10, and the surface of first substrate 10 is scribed by means of a diamond scriber, so as to form groove 15 having a width of 50 μm and a depth of 5 μm at a pitch of 350 μm.

Referring next to FIG. 2B, buffer layer 11 having a thickness of 20 nm is formed on the surface of first substrate 10 where groove 15 is formed, and n-type nitride semiconductor layer 12 (such as an n-type GaN layer and an n-type $Al_pGa_{1-p}N$ layer (0<p<1)) having a thickness of 4 μm and doped with silicon is formed on buffer layer 11. Light-emitting layer 13 having a thickness of 120 nm and including multiple quantum well constituted of a barrier layer composed of GaN and a well layer composed of $In_qGa_{1-q}N$ (0<q<1) is formed on n-type nitride semiconductor layer 12. P-type nitride semiconductor layer 14 (such as a p-type GaN layer and a p-type $Al_rGa_{1-r}N$ layer (0<r<1)) having a thickness of 100 nm is formed on light-emitting layer 13.

Nitride semiconductor layer 20 constituted of buffer layer 11, n-type nitride semiconductor layer 12, light-emitting layer 13, and p-type nitride semiconductor layer 14 is epitaxially grown. As shown in FIG. 2B, at an initial stage of growth, nitride semiconductor layer 20 does not grow on groove 15 of first substrate 10. Therefore, groove 25 is formed in nitride semiconductor layer 20 in correspondence with groove 15 in the surface of first substrate 10.

Thereafter, metal layer 16 establishing ohmic contact with p-type nitride semiconductor layer 14, containing at least Ag and Pd and having high reflectivity is formed on p-type nitride semiconductor layer 14. As one example of a specific method of forming metal layer 16, in the present embodiment, initially, a Pd film is formed to a thickness of approximately 1.5 nm, on which an Ag film is formed to a thickness of 100 nm. As a result of heat treatment for 3 minutes in vacuum at a temperature of 500° C., excellent ohmic contact of Pd, Ag and p-type nitride semiconductor layer 14 is achieved and high reflectivity is attained. Then, bonding layer 18 having a thickness of 1 μm and containing at least AuSn is formed on metal layer 16, to fabricate a semiconductor wafer 1.

Meanwhile, referring to FIG. 2A, the Si substrate serving as a conductive base is employed as second substrate 17, on which bonding layer 18 having a thickness of 1 μm and containing at least AuSn is formed, thus fabricating a substrate wafer 2.

Referring next to FIGS. 2A, 2B and 3, semiconductor wafer 1 is bonded to substrate wafer 2. As an example of a specific method, in the present embodiment, bonding layer 18 of semiconductor wafer 1 is brought in contact with bonding layer 18 of substrate wafer 2. Adhesion between semiconductor wafer 1 and substrate wafer 2 is achieved by using bonding layer 18, as a result of application of pressure of 100 kPa (10N/cm$^2$) in vacuum at a temperature raised to 300° C. Here, bonding layer 18 after adhesion has a thickness of 2 μm.

Thereafter, a laser beam having a wavelength of 355 nm is emitted from the back side of the sapphire substrate serving as first substrate 10, so that a part of buffer layer 11 is decomposed at an interface between first substrate 10 and buffer layer 11, thus separating nitride semiconductor layer 20 and first substrate 10 from each other.

An n-side electrode (electrode 19) is formed on buffer layer 11 exposed on the surface as a result of separation described above. As one example of a method of forming the n-side electrode (electrode 19), in the present embodiment, a photoresist having an opening in a prescribed region on buffer layer 11 is provided (not shown). Thereafter, an Al/Ti film implemented by a Ti film having a thickness of 20 nm and an Al film having a thickness of 200 nm is formed by vapor deposition as the n-side electrode (electrode 19), and the Al/Ti film on the photoresist is removed by using lift-off method. The n-side electrode (electrode 19) is thus formed in the prescribed region on buffer layer 11.

Then, electrode 19 is adhered to an adhesive sheet with the surface where electrode 19 is formed facing downward (not shown). Thereafter, laser beam 33 is emitted from the side of the Si substrate that serves as second substrate 17, so as to carry out division into chips without scribing 31. Here, division into chips is carried out such that groove 25 formed in nitride semiconductor layer 20 and position of division 30 coincide with each other in division into chips. Accordingly, division into chips can easily be performed, with high yield being achieved.

Though the thickness of each layer and each film is specified in the present embodiment, the thickness is not limited as such. It is noted, however, that the Ag film formed as a reflective layer has a thickness preferably not smaller than 10 nm and more preferably not smaller than 50 nm from the viewpoint of improvement in reflectivity. In addition, though the Pd film is used as a part of the reflective film in the present embodiment, a Pt film or an Ni film may be employed instead of the Pd film. Moreover, though division into chips is carried out by means of the laser beam in the present embodiment, division into chips may be carried out by diamond scribing (referring to a method for division into chips by scribing using a diamond scriber) or by dicing (referring to a method for division into chips by means of a diamond blade).

Example 2

Figure 4:
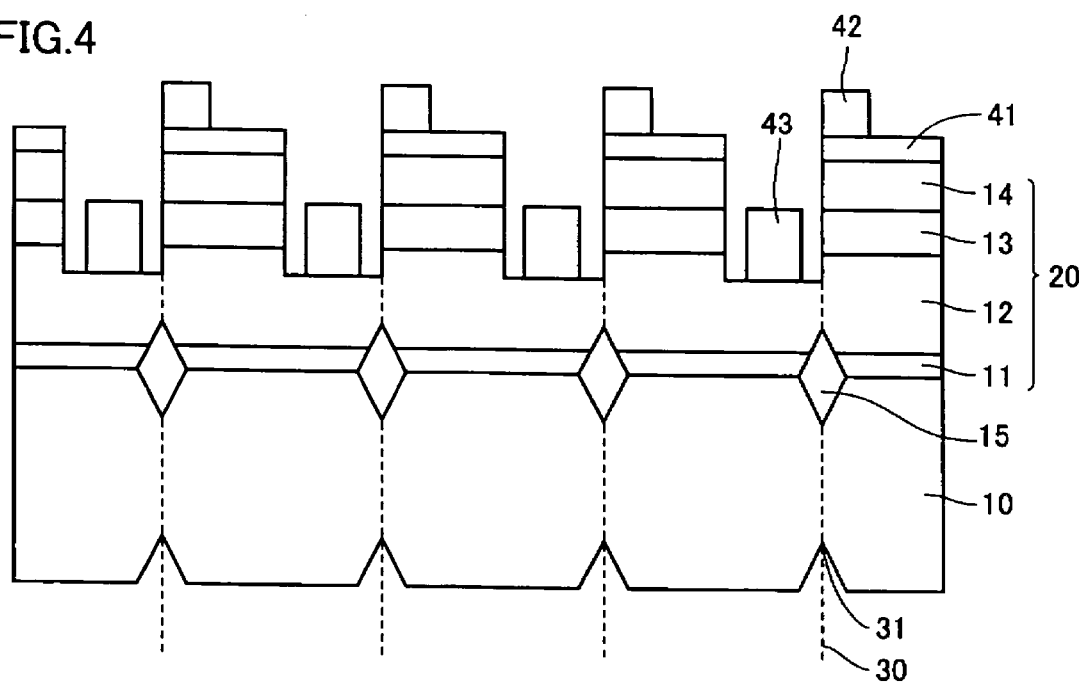
FIG. 4 is a schematic cross-sectional view showing another example of a method of manufacturing a nitride semiconductor device.
Figure 5A:
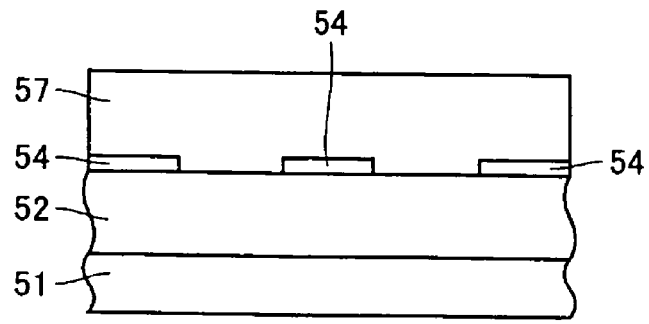
FIGS. 5A to 5D are schematic cross-sectional views showing each of conventional steps.
Figure 5B:
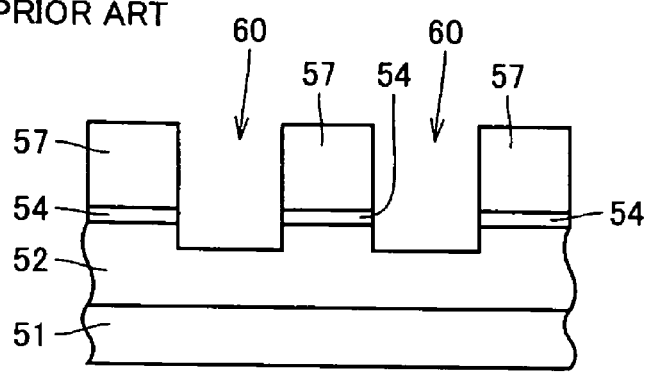
Figure 5C:
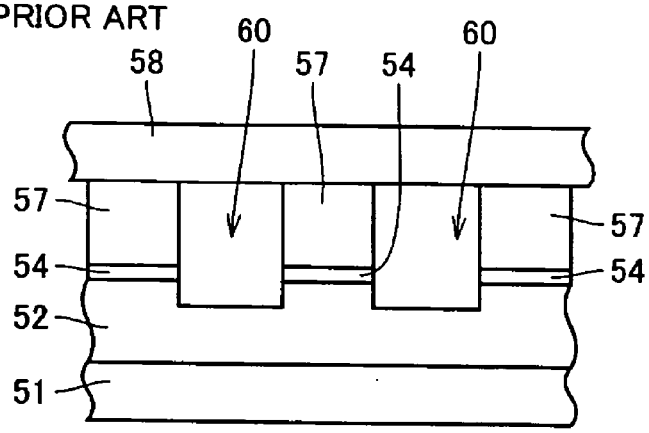
Figure 5D:
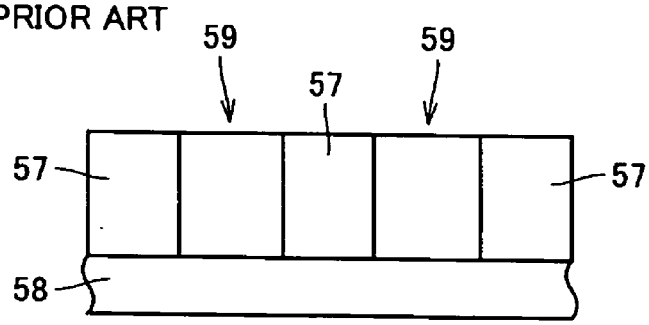

Another example of a method of manufacturing a nitride semiconductor device according to the present invention will be described in the following. Referring to FIG. 4, groove 15 is formed by scribing the surface of first substrate 10 as in the first embodiment. Thereafter, buffer layer 11, n-type nitride semiconductor layer 12, light-emitting layer 13, and p-type nitride semiconductor layer 14 are successively formed. Then, a Pd film is formed to a thickness of 7 nm on p-type nitride semiconductor layer 14 as a translucent electrode 41, on which an Au film is formed to a thickness of 300 nm as a pad electrode 42. Thereafter, a resist having an opening is formed on translucent electrode 41, and translucent electrode 41 (Pd film) under the opening is etched away. Thereafter, p-type nitride semiconductor layer 14, light-emitting layer 13 and a part of n-type nitride semiconductor layer 12 located below the opening is dry-etched so as to expose the surface of n-type nitride semiconductor layer 12. A stacked film implemented by an Hf film and an Al film or an alloy layer thereof is formed on the exposed surface of n-type nitride semiconductor layer 12 as an n-side electrode 43. Here, a pitch between electrode patterns is set such that the electrode pattern is accommodated between scribe lines (grooves 15) in the first substrate.

Thereafter, the first substrate is ground and polished so that its thickness is set to approximately 100 μm, and the back surface of first substrate 10 is scribed 31 by means of the diamond scriber, whereby division into chips is carried out (diamond scribing). Here, the back surface of first substrate 10 is scribed such that scribe line 31 coincides with position of division 30 within groove 15. Division into chips can thus easily be carried out and yield is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a nitride semiconductor device, comprising:
   forming a groove on a surface of a first substrate by scribing;
   forming a nitride semiconductor layer on the surface and overlying the groove without the nitride semiconductor layer epitaxially growing in said groove, wherein said groove has a width of at least 1 μm to at most 350 μm and a depth of at least 0.5 μm to at most 100 μm and not larger than 50% of a thickness of said first substrate;
   bonding said nitride semiconductor layer and a second substrate together;
   separating said nitride semiconductor layer and said first substrate from each other; and
   forming an electrode on said nitride semiconductor layer such that a groove formed in the nitride semiconductor layer and a position of division coincide with each other in division into chips.

2. A method of manufacturing a nitride semiconductor device, comprising:
   forming a groove on a surface of a first substrate by scribing;
   forming a nitride semiconductor layer on the surface and overlying the groove without the nitride semiconductor layer epitaxially growing in said groove, wherein said groove has a width of at least 1 μm to at most 350 μm and a depth of at least 0.5 μm to at most 100 μm and not larger than 50% of a thickness of said first substrate;

bonding said nitride semiconductor layer and a second substrate together;

separating said nitride semiconductor layer and said first substrate from each other; and dividing a wafer including said second substrate and said nitride semiconductor layer into chips, wherein said wafer is divided into said chips such that a groove formed in said nitride semiconductor layer and a position of division coincide with each other.

3. A method of manufacturing a nitride semiconductor device, comprising:

forming a groove on a surface of a first substrate by scribing;

forming a nitride semiconductor layer on the surface without the nitride semiconductor layer epitaxially growing in said groove;

bonding said nitride semiconductor layer and a second substrate together;

separating said nitride semiconductor layer and said first substrate from each other; and forming an electrode on said nitride semiconductor layer such that a groove formed in the nitride semiconductor layer and a position of division coincide with each other in division into chips.

4. A method of manufacturing a nitride semiconductor device, comprising:

forming a groove on a surface of a first substrate by scribing;

forming a nitride semiconductor layer on the surface without the nitride semiconductor layer epitaxially growing in said groove;

bonding said nitride semiconductor layer and a second substrate together;

separating said nitride semiconductor layer and said first substrate from each other; and dividing a wafer including said second substrate and said nitride semiconductor layer into chips, wherein said wafer is divided into said chips such that a groove formed in said nitride semiconductor layer and a position of division coincide with each other.

* * * * *